United States Patent
Verspecht

(10) Patent No.: US 9,252,895 B1
(45) Date of Patent: Feb. 2, 2016

(54) SYSTEM AND METHOD OF MEASURING FULL SPECTRUM OF MODULATED OUTPUT SIGNAL FROM DEVICE UNDER TEST

(71) Applicant: Keysight Technologies, Inc, Minneapolis, MN (US)

(72) Inventor: Jan Verspecht, Steenhuffel (BE)

(73) Assignee: Keysight Technologies, Inc., Santa Rosa, CA (US)

( * ) Notice: Subject to any disclaimer, the term of this patent is extended or adjusted under 35 U.S.C. 154(b) by 4 days.

(21) Appl. No.: 14/341,383

(22) Filed: Jul. 25, 2014

(51) Int. Cl.
*H04B 1/00* (2006.01)
*H04B 17/29* (2015.01)
*H04B 1/16* (2006.01)
*H03D 7/14* (2006.01)

(52) U.S. Cl.
CPC ............ *H04B 17/29* (2015.01); *H03D 7/1441* (2013.01); *H04B 1/16* (2013.01)

(58) Field of Classification Search
USPC ........ 455/226.1, 296, 67.11, 148, 423, 226.2, 455/226.3, 226.4, 267, 313, 317; 375/200, 375/206, 295, 260, 259; 370/329, 332, 335, 370/341, 342, 252, 320
See application file for complete search history.

(56) References Cited

U.S. PATENT DOCUMENTS

| | | | | |
|---|---|---|---|---|
| 6,028,884 A * | 2/2000 | Silberger | ............ | H04B 17/309 370/320 |
| 8,583,049 B2 * | 11/2013 | Collins, III | .......... | H03D 7/1441 455/226.1 |
| 9,046,565 B2 * | 6/2015 | Collins, III | ........ | G01R 31/2822 |
| 2003/0174641 A1 * | 9/2003 | Rahman | ................. | H03D 3/008 370/206 |
| 2006/0020865 A1 * | 1/2006 | Dai | .................. | G01R 31/31813 714/738 |
| 2007/0253469 A1 * | 11/2007 | Kite | ......................... | H04B 3/46 375/148 |
| 2012/0082251 A1 * | 4/2012 | Vanden Bossche | | G01R 13/0272 375/259 |

OTHER PUBLICATIONS

Mohammed El Yaagoubi et al., "Time-Domain Calibrated Measurements of Wideband Multisines Using a Large-Signal Network Analyzer," IEEE Transactions on Microwave Theory and Techniques, vol. 56, No. 5, May 2008, pp. 1180-1192.

Youngseo Ko et al., "Multi-Harmonic Broadband Measurements using an Large Signal Network Analyzer," Microwave Measurements Conference (ARFTG), 2010 75th ARFTG, pp. 1-6.

Peter Blockley et al., "Mixer-Based, Vector-Corrected, Vector Signal/Network Analyzer Offering 300kHz-20GHz Bandwidth and Traceable Phase Response," Microwave Symposium Digest, 2005 IEEE MTT-S International, pp. 1497-1500.

Fabien De Groote et al., "Pulsed Multi-Tone Measurements for Time Domain Load Pull Characterizations of Power Transistors," Microwave Measurement Conference, 2009 73rd ARFTG, pp. 1-4.

* cited by examiner

*Primary Examiner* — Ganiyu A Hanidu

(57) ABSTRACT

A system for measuring a full spectrum of a modulated output signal provided by a device under test (DUT) includes a signal generating device that provides a radio frequency (RF) stimulus signal to the DUT, and generates a trigger signal, where the DUT outputs the modulated output signal in response. A receiver, having an intermediate frequency (IF) bandwidth less than a total bandwidth of the modulated output signal, includes mixers, an analog-to-digital converter (ADC) triggered by the trigger signal, and a local oscillator (LO) that consecutively generates multiple LO signals having different LO frequencies. A harmonic phase reference (HPR) generator generates a repetitive HPR signal having an HPR bandwidth wider than the total bandwidth of the modulated output signal and a modulation repetition rate the same as that of the RF stimulus signal. The mixers consecutively mix the LO signals with the HPR signal and the modulated output signal to provide IF signals input to channels of the ADC to form ADC data records, respectively, that capture the full spectrum of the modulated output signal.

20 Claims, 2 Drawing Sheets

SYSTEM AND METHOD OF MEASURING FULL SPECTRUM OF MODULATED OUTPUT SIGNAL FROM DEVICE UNDER TEST

BACKGROUND

A number of systems and techniques are employed to receive and measure various characteristics of a device under test (DUT), including periodically modulated output signals provided by the DUT in response to a stimulus signal. However, it is difficult to perform accurate and complete measurements of modulated output signals from a DUT using a conventional mixer-based receiver, where the difference between the minimum and maximum frequencies of the modulated output signal (referred to as "total bandwidth") exceeds the intermediate frequency (IF) bandwidth of the receiver (referred to as "IF bandwidth"). The IF bandwidth of a receiver is the bandwidth over which a spectrum analyzer, for example, is able to can measure both amplitude and phase of the modulated output signal. For example, error-vector-magnitude (EVM) of a power amplifier (as the DUT) may be measured using a PNA-X network analyzer, available from Agilent Technologies, Inc., where the power amplifier is excited by a contiguously aggregated five-carrier LTE-A stimulus signal with a bandwidth of 100 MHz. Because of spectral regrowth, the total bandwidth of the amplifier output signal may easily exceed 300 MHz, whereas the IF bandwidth of the PNA-X receiver is only about 40 MHz.

Because of the limited IF bandwidth, at least eight local oscillator (LO) frequency settings are needed in the PNA-X receiver (for receiving the 300 MHz total bandwidth in eight 40 MHz bandwidth portions), along with eight corresponding analog-to-digital converter (ADC) data record acquisitions, in order to capture the spectrum between the lowest and highest frequencies of the total bandwidth (referred to as "full spectrum"). The full spectrum contains the signal power of the amplifier output signal. Each LO setting and corresponding ADC data record introduces an unknown phase shift characteristic to the corresponding measured spectrum. This unknown phase shift characteristic has both a constant and a linear component versus frequency. Because the aforementioned phase shifts are unknown, it is not possible to simply combine the eight measured spectra in the 40 MHz bandwidths into one 320 MHz wide full spectrum. Although the information of the eight acquisitions may be used to reconstruct amplitude of the full spectrum, allowing an accurate measurement of spectral regrowth parameters, such as adjacent-channel-power-ratio (ACPR), the phase information is distorted because of the above-mentioned unknown phase shifts, preventing determination of phase sensitive characteristics, such as EVM.

Accordingly, the current full spectrum measurement methodologies are insufficient for complete measurement of the full spectrum, and an accurate and efficient approach is needed.

SUMMARY

In a representative embodiment, a system is provided for measuring a full spectrum of a modulated output signal provided by a device under test (DUT). The system includes a signal generator, an up-converter, a receiver and a harmonic phase reference (HPR) generator. The signal generator is configured to generate a modulated input signal having a modulation repetition rate, and to generate a trigger signal synchronous with a sub-harmonic of the modulation repetition rate. The up-converter is configured to up-convert the modulated input signal to a radio frequency (RF) stimulus signal provided to the DUT, where the DUT outputs the modulated output signal in response to the RF stimulus signal, the modulated output signal having the same modulation repetition rate as the modulated input signal. The receiver has an intermediate frequency (IF) bandwidth less than a total bandwidth of the modulated output signal. The receiver includes multiple mixers including at least a reference mixer and a first mixer; an analog-to-digital converter (ADC) having multiple channels corresponding to the mixers and triggered by the trigger signal from the signal generator; and a local oscillator (LO) configured to consecutively generate multiple LO signals having different LO frequencies. The HPR generator is configured to generate a repetitive HPR signal having an HPR bandwidth greater than or substantially equal to the total bandwidth of the modulated output signals. The reference mixer is configured to consecutively mix the HPR signal from the HPR generator with the LO signals to provide HPR IF signals input to a reference channel of the ADC, and the first mixer is configured to consecutively mix the modulated output signal from the DUT with the LO signals to provide first IF signals corresponding to the HPR IF signals and input to a first channel of the ADC, the HPR IF signals and the corresponding modulated output IF signals forming ADC data records, respectively. The number of different LO frequencies of the LO signals is selected to provide enough ADC data records to capture the full spectrum corresponding to the total bandwidth of the modulated output signal from the DUT.

In another representative embodiment, a method is provided for measuring a full spectrum of a modulated output signal from a DUT at a receiver, the receiver comprising multiple mixers and an ADC having multiple channels corresponding to the mixers. The method includes generating a modulated input signal including a modulation repetition rate; providing an RF stimulus signal to the DUT, where the DUT provides the modulated output signal in response to the RF stimulus signal, the modulated output signal having the same modulation repetition rate as the RF stimulus signal; generating a trigger signal, synchronous with a sub-harmonic of the modulated repetition rate for triggering ADC acquisition; generating a repetitive harmonic phase reference (HPR) signal having a bandwidth that is greater than or substantially equal to the total bandwidth of the modulated output signals; consecutively generating multiple LO signals having different corresponding LO frequencies; and mixing the HPR signal with the multiple LO signals to provide HPR IF signals, and inputting the HPR IF signals to a reference channel of the ADC; mixing the modulated output signal with the multiple LO signals to provide first IF signals, and inputting the first IF signals to a first channel of the ADC according to the trigger signal, used to align each ADC acquisition with a modulation period of the respective first IF signals; and forming ADC data records from the HPR IF signals and the corresponding first IF signals, respectively. The number of different LO frequencies of the LO signals is selected to provide enough ADC data records to capture the full spectrum of the modulated output signal through spectral stitching.

In another representative embodiment, a system is provided for measuring a full spectrum of a modulated output signal provided by a DUT. The system includes a signal generating device, a receiver and a harmonic phase reference (HPR) generator. The signal generating device is configured to provide a RF stimulus signal to the DUT, and to generate a trigger signal synchronous with a sub-harmonic of a modulation repetition rate of the RF stimulus signal, wherein the DUT outputs the modulated output signal in response to the RF stimulus signal. The receiver has an intermediate frequency (IF) bandwidth less than a total bandwidth of the modulated output signal. The receiver includes multiple mixers including at least a reference mixer and a first mixer; an ADC including multiple channels corresponding to the mixers and triggered by the trigger signal from the signal generating device; and an LO configured to consecutively generate multiple LO signals having different LO frequencies. The HPR generator is configured to generate a repetitive HPR signal having an HPR bandwidth greater than or substantially equal to the total bandwidth of the modulated output signal. The reference mixer is configured to consecutively mix the HPR signal from the HPR generator with the LO signals to provide HPR IF signals input to a reference channel of the ADC, and the first mixer is configured to consecutively mix the modulated output signal from the DUT with the LO signals to provide first IF signals corresponding to the HPR IF signals and input to a first channel of the ADC. The HPR IF signals and the corresponding first IF signals form ADC data records, respectively. The ADC data records capture the full spectrum corresponding to the total bandwidth of the modulated output signal from the DUT.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various representative embodiments generally incorporate a receiver having an analog-to-digital converter (ADC) that receives a trigger signal, generated by a signal generating device that also provides a stimulus signal to the device under test (DUT), for each ADC data record (one per multiple LO settings), in combination with a harmonic phase reference (HPR) signal sent to a reference channel of the receiver. The trigger signal is synchronous with a sub-harmonic of the modulation repetition rate of the stimulus signal. It is therefore possible for a mixer-based receiver to measure phase and amplitude of tones in a broadband periodically modulated signal, whereby the lower limit to a modulation repetition rate is not determined by the signal-to-noise ratio (SNR) of the HPR signal, as in some conventional systems.

Figure 1:
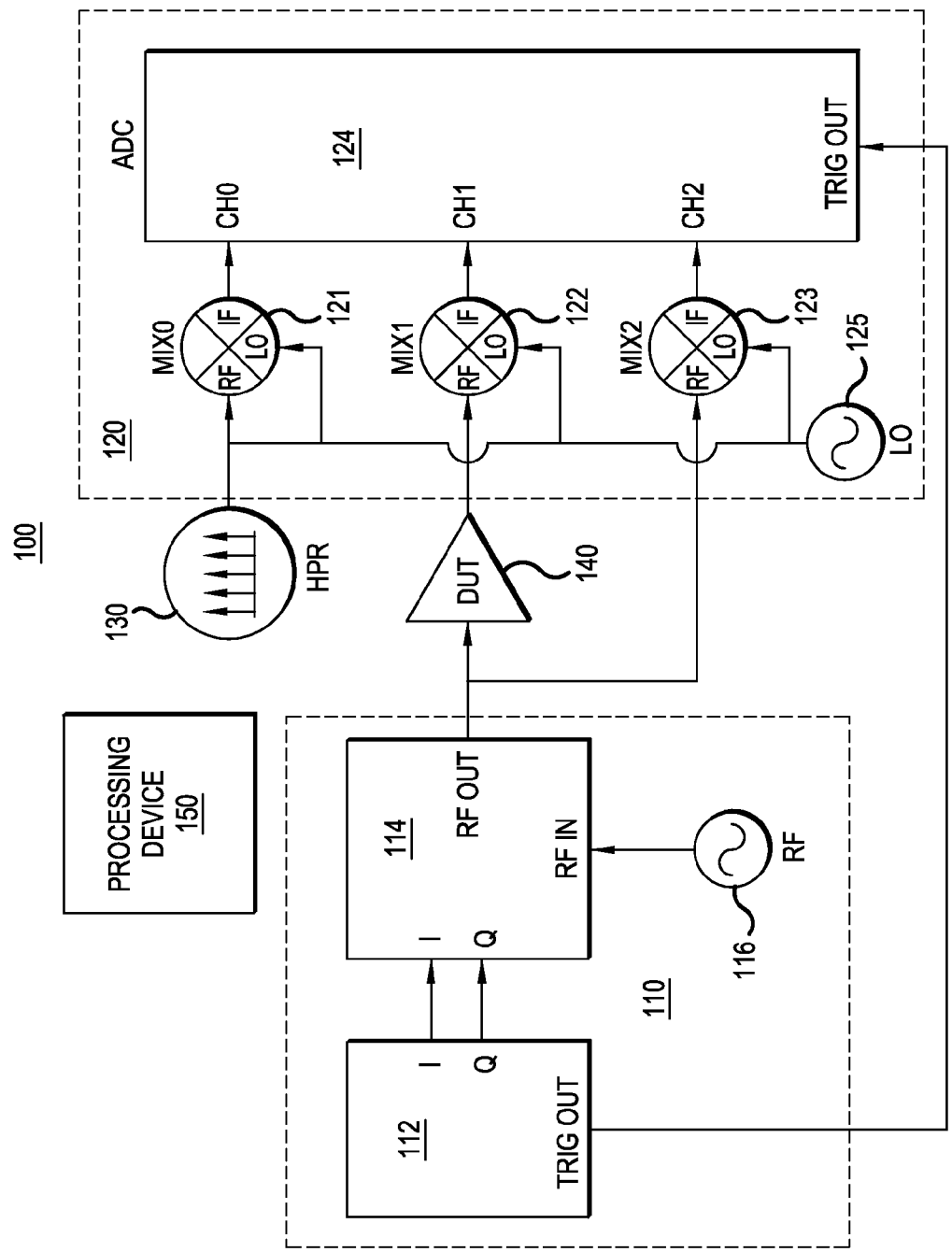
FIG. 1 is a simplified block diagram of a system for measuring a full spectrum of a modulated signal output by a device under test (DUT), according to a representative embodiment.

FIG. 1 is a simplified block diagram of a system for measuring a full spectrum of a modulated signal output by a device under test (DUT), according to a representative embodiment.

Referring to FIG. 1, spectrum measuring system 100 includes a radio frequency (RF) signal generating device 110, a receiver 120 and a harmonic phase reference (HPR) generator 130 configured to measure an output signal of DUT 140. The DUT 140 may be a power amplifier, for example, although the DUT 140 may be other types of devices.

The RF signal generating device 110 is configured to generate an RF stimulus signal for exciting the DUT 140. In the depicted embodiment, the RF signal generating device 110 includes a signal generator 112 and an RF up-converter 114. The signal generator 112 may be an arbitrary wave generator (AWG), for example, having in-phase (I) and quadrature (Q) outputs. More particularly, the signal generator 112 is configured to generate an IQ modulated input signal having a repetition rate of modulation (e.g., 1 kHz) and a predetermined modulation bandwidth (e.g., 100 MHz), for example. The signal generator 112 is further configured to generate a trigger signal that is synchronous with a sub-harmonic of the modulation repetition rate of the modulated input signal. The RF up-converter 114, which may be an IQ-modulator, is configured to up-convert the modulated input signal received from the signal generator 112 to the RF stimulus signal (e.g., 1 GHz), using RF oscillator 116. The RF oscillator 116 may be adjustable to accommodate a variety of frequencies for the RF stimulus signal.

The DUT 140 receives the RF stimulus signal from the RF signal generating device 110, and outputs a modulated output signal in response to the RF stimulus signal. The modulated output signal has the same modulation repetition rate (e.g., 1 kHz) as the modulated input signal provided by the signal generator 112, as well as the RF stimulus signal provided by the RF up-converter 114. The modulation bandwidth of the output signal will typically be significantly larger than the modulation bandwidth of the modulated input signal due to spectral regrowth caused by nonlinear effects. In the present example, the modulated output signal of the DUT 140 will be a modulated 1 GHz carrier, where the repetition rate of the modulation will also be 1 kHz.

The HPR generator 130 is configured to generate a repetitive HPR signal, which has an HPR bandwidth that is wider than (or substantially equal to) the bandwidth of the modulated output signal (as well as the bandwidth of the modulated input signal). The HPR signal includes multiple tones, evenly spaced from one another, in a number sufficient to cover the total bandwidth of the modulated output signal. The amplitude of the tones present in the repetitive HPR signal should be sufficiently high to ensure a good signal-to-noise ratio (SNR). This may be achieved, for example, by using a sufficiently high repetition rate for the HPR.

The receiver 120 includes an ADC 124 triggered by the trigger signal output by the signal generator 112, multiple mixers indicated by representative reference mixer 121, first mixer 122 and second mixer 123, and a local oscillator (LO) 125 configured to consecutively generate different LO signals having different LO frequencies, as discussed below. The ADC 124 has multiple channels, which are indicated by representative reference channel CH0 for receiving the output (IF signal) of the reference mixer 121, first channel CH1 for receiving the output of the first mixer 122, and second channel CH2 for receiving the output of the second mixer 123. Generally, the receiver 120 has an IF bandwidth much less than a total bandwidth of the modulated output signal provided by the DUT 140. The receiver 120 therefore is unable to receive the entire modulated output signal at the same time, and thus is configured to receive portions of the modulated output signal (via the first mixer 122) using the different LO signal frequencies from the LO 125, as discussed below.

The receiver 120 is configured to receive the HPR signal from the HPR generator 130, the modulated output signal from the DUT 140, and (optionally) the RF stimulus signal from the RF signal generating device 110. More particularly, the reference mixer 121 of the receiver 120 receives the HPR signal at an RF port and the LO signal at an LO port, and outputs an HPR IF signal to the reference channel CH0 of the ADC 124. Likewise, the first mixer 122 receives the modulated output signal at an RF port and the LO signal at an LO port, and outputs a first IF signal to the first channel CH1 of the ADC 124. When used, the second mixer 123 receives RF stimulus signal at an RF port and the LO signal at an LO port, and outputs a second IF signal to the second channel CH2 of the ADC 124. The trigger signal triggering the ADC 124 aligns the modulation period of the modulated output signal from the DUT 140 with ADC acquisition at each of the multiple channels.

The HPR IF signals and the first and second output IF signals corresponding to the different LO frequencies collectively form ADC data records, respectively. Each ADC data record includes at least one tone of the HPR signal, where phase of the at least one tone of the HPR signal may be measured to determine phase relationships between consecutive LO signals of the multiple LO signals in order to align the ADC data records. In an embodiment, the ADC data records may include only the HPR IF signals and the corresponding first output IF signals (and do not include modulated second output IF signals). Phase measurements of the HPR IF signals may be used to eliminate phase uncertainty of the first IF signals, e.g., caused by changing the LO frequency.

As mentioned above, the modulated output signal of the DUT 140 is sent to the first channel CH1 of the ADC 124. Because of spectral re-growth, considering 3rd order intermodulation products, the total bandwidth of the modulated output signal can be expected to be at least 300 MHz, for example. Considering that the receiver 120 has a smaller IF bandwidth, such as 40 MHz, for example, the bandwidth of the HPR signal is chosen to equal to 40 MHz. The HPR signal is sent from the HPR generator 130 to the reference channel CH0 of the ADC 124. Notably, the repetition rate of the HPR signal (the spacing of the tones) is sufficiently high to guarantee a good SNR. Of course, total bandwidths of the modulated output signal other than 300 MHz and IF bandwidths of the receiver 120 other than 40 MHz may be incorporated.

As mentioned above, each LO signal is output by the LO 125 to each of the reference mixer 121, the first mixer 122 and the second mixer 123 at the same time. In other words, the reference mixer 121, the first mixer 122 and the second mixer 123 respectively receive the same frequency LO signal, even as the frequency of the LO signal changes. The set of different LO frequencies is chosen to make it possible to scan the full spectrum of the modulated output signal from the DUT 140 using the limited IF bandwidth of the receiver 120. That is, the number of different LO frequencies of the LO signals is selected to provide enough ADC data records to capture the full spectrum corresponding to the total bandwidth of the modulated output signal from the DUT 140. The different LO frequencies of the LO signals and the number of samples in each ADC data record are selected such that the IF frequencies of the HPR IF signals output by the reference mixer 121 and the first IF signal output by the first mixer 122 (and the second IF signal output by the second mixer 123, when used) correspond to discrete Fourier transform bins of the ADC data records, and at the same time do not cause interference between direct and image mixing products and/or (eventually) between direct and indirect harmonic mixing products. When the second IF signal output by the second mixer 123 is used, together with the HPR IF signals, the corresponding ADC data records enable measurement of the RF stimulus signal in a similar matter. For example, complex envelopes of the second IF signals in the second channel CH2 of the ADC 124 may be measured when the second IF signals are used.

For example, in the present illustration in which the total bandwidth of the modulated output signal is about 300 MHz and the IF bandwidth of the receiver 120 is about 40 MHz, the set of LO frequencies may be determined as follows: 820 MHz+K×40 MHz-250 Hz, where K ranges from 0 to 8, thereby generating nine ADC data records. The offset (e.g., 250 Hz in this example) is necessary to avoid interference with the image frequencies. Accordingly, the LO 125 would consecutively generate nine LO signals having different LO frequencies equal to about 820 MHz, 860 MHz, 900 MHz, 940 MHz, 980 MHz, 1020 MHz, 1060 MHz, 1100 MHz, and 1140 MHz, respectively.

The ADC 124 is triggered at a rate of 250 Hz, e.g., by the trigger signal generated by the signal generator 112, synchronously with a sub-harmonic of a 1 kHz repetition rate of the modulation in the modulated output signal. The nine ADC data records (one for each LO frequency setting) cover the whole frequency range of interest across the total bandwidth of the modulated output signal (i.e., the full spectrum), and each ADC data record contains at least one tone of the HPR signal. The measured phase of the HPR tone in each data record can then be used to eliminate the unknown arbitrary phase shifts introduced in the ADC data record whenever the LO frequency is changed. That is, the constant and linear unknown phase shifts are eliminated using the measured phases of the HPR tones. This enables the combination of the measured 40 MHz wide parts (nine in total) into one 320 MHz wide full spectrum, containing both amplitude and phase of all tones (i.e., at least one per ADC data record), which may be referred to as "spectral stitching." This data may be used to reconstruct the complex envelope of the modulated output signal from the DUT 140 and to determine phase dependent parameters, such as EVM.

In various embodiments, the spectrum measuring system 100 may further include a processing unit 150 configured to control operations of the spectrum measuring system 100. The processing unit 150 may be included in the spectrum measurement device 100 or may be a separate device, such as a personal computer (PC). The processing unit 150 is connected to one or more of the components of the spectrum measuring system 100, such as the RF signal generating device 110, the receiver 120 and/or the HPR generator 130, for controlling various aspects of measuring signals of the DUT 180, including execution of various steps depicted in FIG. 2, discussed below. For example, the processing unit 150 may be configured to control the RF oscillator 116 to adjust the carrier frequency of the RF stimulus signal, to control the LO 125 to set and adjust the LO frequencies for providing the ADC data records, and to control the HPR generator to adjust the modulation bandwidth and repetition rate to correspond to those of to the modulated input signal from the signal generator 112. Although no specific connections to the processing unit 150 are shown in FIG. 1 for the sake of convenience, it is understood that any type of wired and/or wireless connections between the processing unit 150 and components of the spectrum measuring system 100, enabling transmission of communication and control signals, may be incorporated without departing from the scope of the present teachings.

Generally, the processing unit 150 may be implemented by a computer processor (e.g., of a PC or dedicated workstation), application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions. In an embodiment, the computer processor may comprise a central processing unit (CPU), for example, executing an operating system. The processing unit 150 may include a storage device, such as random access memory (RAM), read-only memory (ROM), flash memory, electrically programmable ROM (EPROM), electrically erasable programmable ROM (EEPROM), hard disk drive (HDD), or the like. Data from various measurements and characterizations of the DUT 180 may be displayed and/or stored for analysis, for example. A user interface, such as a graphical user interface (GUI) may be included with the processing unit 150 for a user to control operations and/or view data and computation results of the measurement device 100.

In an embodiment, the measuring device 100 may be a vector network analyzer (VNA), for example, such as an N523xA PNA-L Series or N524xA PNA-X Series VNA, available from Agilent Technologies, Inc., although other types of measuring devices (or measuring systems) may be incorporated without departing from the scope of the present teachings.

Figure 2:
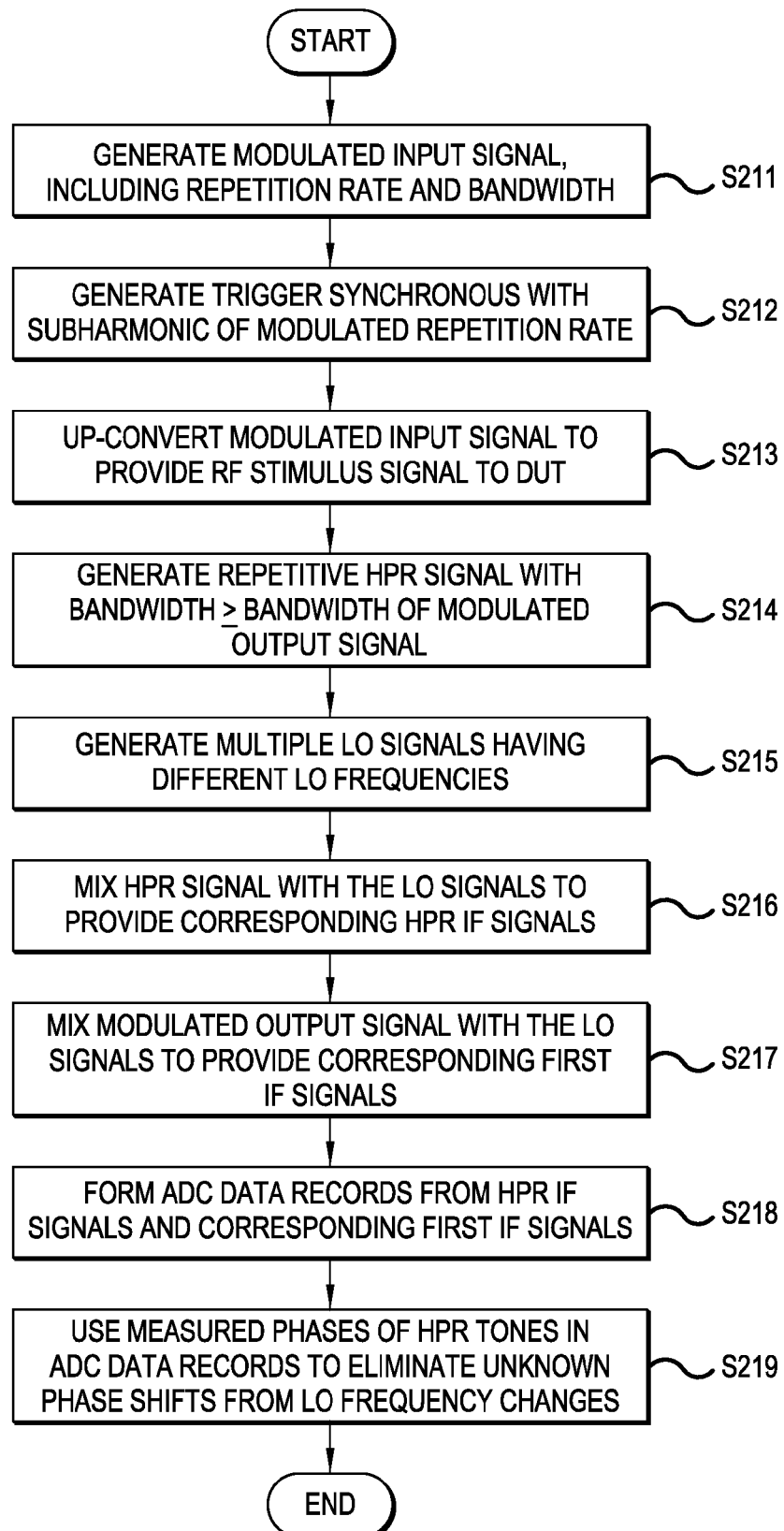
FIG. 2 is a flow diagram showing a method of measuring a full spectrum of a modulated signal output by DUT, according to a representative embodiment.

FIG. 2 is a flow diagram showing a method of measuring a full spectrum of a modulated signal output by DUT, according to a representative embodiment.

For purposes of illustration, the DUT (e.g., DUT 140) is assumed to be a power amplifier, although the method may apply to other types of DUTs without departing from the scope of the present teachings. Also, all or part of the steps or operations shown in FIG. 2 may be executed by a processing unit (e.g., processing unit 150) and/or a VNA, for example, mentioned above. The processing unit may be included in the VNA or may be a separate device, such as a PC, as mentioned above.

Referring to FIG. 2, a method is provided for measuring a full spectrum of a modulated output signal from a DUT, such as a power amplifier (e.g., DUT 140) at a receiver (e.g., receiver 120), where the receiver includes mixers and an ADC having multiple channels corresponding to the mixers. In block S211, a modulated input signal, including a modulation repetition rate and having a modulated bandwidth, is generated by a signal generator (e.g., signal generator 112). A trigger signal is generated (e.g., by the signal generator) in block S212, where the trigger signal is synchronous with a sub-harmonic of the modulated repetition rate for triggering ADC acquisition.

In block S213, the modulated input signal is up-converted to an RF stimulus signal (e.g., by RF up-converter 114), which is provided to the DUT. In response to the RF stimulus signal, the DUT provides a modulated output signal, which has the same modulation repetition rate as the modulated input signal. In block S214, a repetitive HPR signal is generated (e.g., by HPR generator 130). The HPR signal has a bandwidth that is greater than or substantially equal to the bandwidth of the modulated output signal, as well as the bandwidth of the modulated input signal.

Multiple LO signals are consecutively generated (e.g., by LO 125) in block S215, where the LO signals have different LO frequencies. For example, a set of multiple LO signals may have LO frequencies that increase by a predetermined amount until the entire set of LO signals has been generated consecutively. In block S216, the HPR signal is mixed with the LO signals to provide corresponding HPR IF signals, which are input to a reference channel of the ADC (e.g., reference channel CH0). Similarly, the modulated output signal of the DUT is mixed with the LO signals to provide corresponding modulated first IF signals in block S217, which are input to a corresponding channel of the ADC (e.g., first channel CH1) according to the trigger signal. The trigger signal is used to align each ADC acquisition with a modulation period of the respective modulated first IF signals at the first channel. The HPR IF signals from block S216 and the corresponding first IF signals from block S217 form ADC data records, respectively, in block S218. Each ADC data record therefore includes at least one HPR tone of the corresponding HPR IF signal. Also, the number of different LO frequencies of the multiple LO signals is selected to provide enough ADC data records to capture the full spectrum of the modulated output signal through spectral stitching.

In block S219, measured phase of the HPR tones in the ADC data records are used to eliminate phase uncertainty of the modulated first IF signals caused by changing the LO frequency. That is, the constant and linear unknown (arbitrary) phase shifts caused by the frequency changes of the LO signals are eliminated using the measured phases of the HPR tones. Also, the method may further include measuring amplitude and phase of tones in the first IF signals in the first channel of the receiver ADC.

In an embodiment, the RF stimulus signal may also be mixed consecutively with the multiple LO signals to provide second IF signals. The second IF signals are input to a second channel of the receiver ADC, where the trigger signal is used to align each ADC acquisition with a modulation period of the respective second IF signals at the second channel. The second IF signals further form the ADC data records, respectively, along with the HPR IF signals and the first IF signals, discussed above. Complex envelopes of the second IF signals may be measured in the corresponding channel (e.g., second channel CH2) of the receiver ADC.

Each HPR IF signal input to the reference channel of the ADC, which corresponds to one LO frequency and one part of the full spectrum of the modulated output signal, may include at least one tone of the HPR signal. A measured phase of the at least one tone provides information on phase of the LO frequency. The phase of the LO frequency may be eliminated from measurements of the modulated output signals from the DUT using the provided phase information in order to perform the spectral stitching.

The various embodiments described herein provide a number of advantages. For example, the measurement system and method work for mixer-based receivers, work without the need to perform redundant measurements, and do not require the absence of wide gaps in the spectrum. Also, the lower limit on the modulation repetition rate is not determined by the SNR of the HPR, as in some conventional techniques. In addition, the phase accuracy is independent of the number of ADC data records that are needed to construct the complete spectrum. Further, non-adjacent parts of the full spectrum may be measured, so there is no need to measure portions of the full spectrum that are between the spectral portions that are of interest.

Notably, the various embodiments apply to multiple channel receivers, which enable coherent measurement of a multitude of signals. So, for example, in addition measuring the modulated output signal of a power amplifier, the input signal (i.e., the RF stimulus signal) may also be measured. Further, using a five-channel receiver, for example, all incident and reflected waves that are present at both input and output ports of the power amplifier may be measured in the same manner.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A system for measuring a full spectrum of a modulated output signal provided by a device under test (DUT), the system comprising:
a signal generator configured to generate a modulated input signal having a modulation repetition rate, and to generate a trigger signal synchronous with a sub-harmonic of the modulation repetition rate;
an up-converter configured to up-convert the modulated input signal to a radio frequency (RF) stimulus signal provided to the DUT, wherein the DUT outputs the modulated output signal in response to the RF stimulus signal, the modulated output signal having the same modulation repetition rate as the modulated input signal;
a receiver having an intermediate frequency (IF) bandwidth less than a total bandwidth of the modulated output signal, the receiver comprising:
a plurality of mixers including at least a reference mixer and a first mixer;
an analog-to-digital converter (ADC) comprising a plurality of channels corresponding to the plurality of mixers and triggered by the trigger signal from the signal generator; and
a local oscillator (LO) configured to consecutively generate a plurality of LO signals having different LO frequencies; and
a harmonic phase reference (HPR) generator configured to generate a repetitive HPR signal having an HPR bandwidth wider than or substantially equal to the total bandwidth of the modulated output signal,
wherein the reference mixer is configured to consecutively mix the HPR signal from the HPR generator with the plurality of LO signals to provide HPR IF signals input to a reference channel of the ADC, and the first mixer is configured to consecutively mix the modulated output signal from the DUT with the plurality of LO signals to provide first IF signals corresponding to the HPR IF signals and input to a first channel of the ADC, the HPR IF signals and the corresponding first IF signals forming ADC data records, respectively, and
wherein the number of different LO frequencies of the LO signals is selected to provide enough ADC data records to capture the full spectrum corresponding to the total bandwidth of the modulated output signal from the DUT.

2. The system of claim 1, wherein the HPR signal includes multiple tones, evenly spaced from one another, in a number sufficient to cover the total bandwidth of the modulated output signal.

3. The system of claim 2, wherein each ADC data record includes at least one tone of the HPR signal, and measured phases of the tones in the ADC data records are used to eliminate unknown phase shifts caused by the different LO frequencies.

4. The system of claim 1, wherein each ADC data record corresponds to a portion of the full spectrum of the modulated output signal.

5. The system of claim 1, wherein the signal generator comprises an arbitrary waveform generator (AWG), and the up-converter comprises an IQ-modulator.

6. The system of claim 5, wherein the trigger signal triggering the ADC aligns the modulation period of the modulated output signal with ADC acquisition at each of the plurality of channels.

7. The system of claim 1, wherein the HPR repetition rate is sufficiently high to ensure a good signal-to-noise ratio (SNR).

8. The system of claim 1, wherein the different LO frequencies of the LO signals and the number of samples in each ADC data record are selected such that frequencies of the HPR IF signals and the corresponding first IF signals correspond to discrete Fourier transform bins of the ADC data records, respectively, and do not cause interference between direct and image mixing products and direct and indirect harmonic mixing products.

9. The system of claim 3, wherein phase of the at least one tone of the HPR signal in each ADC data record is measured to determine phase relationships between consecutive LO signals of the plurality of LO signals in order to align the ADC data records.

10. The system of claim 1, wherein the plurality of mixers further include a second mixer, and
wherein the second mixer is configured to consecutively mix the RF stimulus signal with the plurality of LO signals to provide second IF signals corresponding to the HPR IF signals and input to a second channel of the ADC, the second IF signals further forming the ADC data records, respectively.

11. A method of measuring a full spectrum of a modulated output signal from a device under test (DUT) at a receiver, the receiver comprising a plurality of mixers and an analog-to-digital converter (ADC) having a plurality of channels corresponding to the plurality of mixers, respectively, the method comprising:
providing a radio frequency (RF) stimulus signal to the DUT, wherein the DUT provides the modulated output signal in response to the RF stimulus signal, the modulated output signal having the same modulation repetition rate as the RF stimulus signal;
generating a trigger signal, synchronous with a sub-harmonic of the modulated repetition rate for triggering ADC acquisition;
generating a harmonic phase reference (HPR) signal having a bandwidth that is greater than or substantially equal to a bandwidth of the modulated output signal, and having evenly spaced tones in a number sufficient to cover the total bandwidth of the modulated output signal;

consecutively generating a plurality of local oscillator (LO) signals having different corresponding LO frequencies; and mixing the HPR signal with the plurality of LO signals to provide HPR IF signals, and inputting the HPR IF signals to a reference channel of the ADC;

mixing the modulated output signal with the plurality of LO signals to provide first IF signals, and inputting the first IF signals to a first channel of the ADC according to the trigger signal, used to align each ADC acquisition with a modulation period of the respective first IF signals at the first channel;

forming ADC data records from the HPR IF signals and the corresponding first IF signals, respectively, each of the ADC data records having at least one HPR tone of the corresponding HPR IF signal; and eliminating unknown phase shifts caused by the different LO frequencies using measured phases of the HPR tones in ADC data records.

12. The method of claim 11, wherein the number of different LO frequencies of the plurality of signals is selected to provide enough ADC data records to capture the full spectrum of the modulated output signal through spectral stitching.

13. The method of claim 11, further comprising:
measuring amplitude and phase of tones in the modulated output IF signals in the first channel of the receiver ADC.

14. The method of claim 11, further comprising:
mixing the RF stimulus signal with the plurality of LO signals to provide second IF signals, and inputting the second IF signals to a second channel of the receiver ADC, wherein the second IF signals further form the ADC data records, respectively.

15. The method of claim 14, further comprising:
measuring complex envelopes of the second IF signals in the second channel of the receiver ADC.

16. The method of claim 11, wherein each HPR IF signal input to the reference channel of the ADC, which corresponds to one LO frequency and one part of the full spectrum of the modulated output signal, comprises at least one tone of the HPR signal.

17. A system for measuring a full spectrum of a modulated output signal provided by a device under test (DUT), the system comprising:

a signal generating device configured to provide a radio frequency (RF) stimulus signal to the DUT, and to generate a trigger signal synchronous with a sub-harmonic of a modulation repetition rate of the RF stimulus signal, wherein the DUT outputs the modulated output signal in response to the RF stimulus signal;

a receiver having an intermediate frequency (IF) bandwidth less than a total bandwidth of the modulated output signal, the receiver comprising:

a plurality of mixers including at least a reference mixer and a first mixer;

an analog-to-digital converter (ADC) comprising a plurality of channels corresponding to the plurality of mixers and triggered by the trigger signal from the signal generating device; and a local oscillator (LO) configured to consecutively generate a plurality of LO signals having different LO frequencies; and a harmonic phase reference (HPR) generator configured to generate a repetitive HPR signal having an HPR bandwidth greater than or substantially equal to the total bandwidth of the modulated output signal, wherein the reference mixer is configured to consecutively mix the HPR signal from the HPR generator with the plurality of LO signals to provide HPR IF signals input to a reference channel of the ADC, and the first mixer is configured to consecutively mix the modulated output signal from the DUT with the plurality of LO signals to provide first IF signals corresponding to the HPR IF signals and input to a first channel of the ADC, the HPR IF signals and the corresponding first IF signals forming ADC data records, respectively, and wherein the ADC data records capture the full spectrum corresponding to the total bandwidth of the modulated output signal from the DUT.

18. The system of claim 17, wherein each HPR IF signal input to the reference channel of the ADC, which corresponds to one LO frequency and one part of the full spectrum of the modulated output signal, comprises at least one tone of the HPR signal, a measured phase of the at least one tone providing information on phase of the LO frequency.

19. The system of claim 18, wherein the phase of the LO frequency is eliminated from measurements of the modulated output signals using the provided phase information in order to perform the spectral stitching.

20. The system of claim 17, wherein a repetition rate of the HPR signal is sufficiently high to ensure a good signal-to-noise ratio (SNR).

\* \* \* \* \*